United States Patent [19]

Murakata et al.

[11] Patent Number: 5,281,509
[45] Date of Patent: Jan. 25, 1994

[54] LITHOGRAPHY PRINTING PLATE

[75] Inventors: Tetsunobu Murakata; Hideaki Baba; Akio Yoshida; Kazuhisa Nakao; Motozo Yamano; Yasuo Tsubai, all of Tokyo, Japan

[73] Assignee: Mitsubishi Paper Mills Limited, Tokyo, Japan

[21] Appl. No.: 942,187

[22] Filed: Sep. 9, 1992

[30] Foreign Application Priority Data

| Sep. 10, 1991 | [JP] | Japan | 3-259655 |
| Sep. 19, 1991 | [JP] | Japan | 3-268764 |
| Sep. 19, 1991 | [JP] | Japan | 3-268765 |
| Sep. 19, 1991 | [JP] | Japan | 3-268766 |
| Sep. 19, 1991 | [JP] | Japan | 3-268767 |
| Oct. 4, 1991 | [JP] | Japan | 3-285623 |
| Oct. 14, 1991 | [JP] | Japan | 3-294942 |

[51] Int. Cl.$^5$ .................................................. G03C 5/54
[52] U.S. Cl. ................................. 430/207; 430/204; 430/227; 430/229; 430/950
[58] Field of Search ............... 430/204, 207, 229, 950, 430/227

[56] References Cited

U.S. PATENT DOCUMENTS

| 3,728,114 | 4/1973 | Futaki et al. | 430/204 |
| 4,134,769 | 1/1979 | Yoshida et al. | 430/204 |
| 4,160,700 | 7/1979 | Tsubai et al. | 430/204 |
| 4,336,321 | 6/1982 | Kanada et al. | 430/204 |
| 4,501,811 | 2/1985 | Saikawa et al. | 430/204 |
| 4,510,228 | 4/1985 | Tsubai et al. | 430/204 |
| 4,621,041 | 11/1986 | Saikawa et al. | 430/204 |

*Primary Examiner*—Richard L. Schilling
*Attorney, Agent, or Firm*—Cushman, Darby & Cushman

[57] ABSTRACT

Disclosed is a light-sensitive element for lithographic printing plates excellent in stain resistance and water-carrying capacity which comprises a support and, coated thereon in succession, at least one undercoat layer, a silver halide emulsion layer and a physical development nuclei layer wherein at least one of the layers on the silver halide emulsion layer-provided side of the support contains 0.1–2.0 g/m$^2$ of a matting agent of 5μ in average particle size and the light-sensitive element has an arithmetical mean deviation of profile Ra of 1.2 or less.

6 Claims, No Drawings

LITHOGRAPHY PRINTING PLATE

BACKGROUND OF THE INVENTION

The present invention relates to a photographic element for the production of lithographic printing plates by the silver complex diffusion transfer process.

Lithographic printing plates consist of greasy ink receptive oleophilic image portions and ink repellent oleophobic non-image portions and the non-image portions are generally water receptive hydrophilic areas. The usual lithographic printing is carried out by feeding both water and ink to the printing plate surface to allow the image portions to receive preferentially colored ink and the non-image portions to receive preferentially water and then transferring the ink deposited on the image portions onto a substrate such as paper.

Accordingly, in order to obtain prints of good quality, it is necessary that oleophilic activity of the image portions and hydrophilic activity of the non-image portions are both strong enough so that when water and ink are applied, the image portions may receive sufficient amount of ink while the non-image portions may completely repel the ink.

Light-sensitive elements used for making lithographic printing plates utilizing the silver complex diffusion transfer process (DTR process), especially those which comprise a silver halide emulsion layer and a physical development nuclei layer provided thereon have been proposed, for example, in U.S. Pat. Nos. 3,728,114, 4,134,769, 4,160,670, 4,336,321, 4,501,811, 4,510,228 and 4,621,041. According to these techniques, exposed silver halide crystal undergoes chemical development by DTR development to become black silver, which constitutes hydrophilic non-image portions and unexposed silver halide crystal is converted to a silver complex salt by the silver halide complexing agent contained in the developer, which diffuses to the surface physical development nuclei layer and undergoes physical development in the presence of the nuclei to form the ink receptive image portions mainly composed of physically developed silver.

In these lithographic printing plates, silver images precipitated on the physical development nuclei layer provided on gelatino-silver halide emulsion layer are utilized as ink receptive image portions. Therefore, these printing plates are inferior to general lithographic printing plates such as PS plate in resistance to mechanical wear of image portions and have the defects that the image portions wear off or the ink receptivity of the image portions is gradually lost during printing.

If hardness of gelatin is enhanced or amount of the physical development nuclei is increased in order to solve the above defects, staining resistance of the printing plates much lowers. Further, in the above lithographic printing plates hydrophilicity of the non-image portions is realized mainly by hydrophilicity of the surface of gelatin and this has the defect that staining resistance is apt to be reduced by printing as compared with hydrophilized aluminum surface which is mainly used in general lithographic printing plates.

Influence of surface roughness of lithographic printing plates on printability has also been known in the field of PS plate and it has become clear that the surface roughness is also an important factor in the lithographic printing plates made utilizing the silver complex diffusion transfer process of the present invention. Especially, in the lithographic printing plates made using the silver complex diffusion transfer process, the non-image portions are composed mainly of gelatin film and although the gelatin film is inherently high in hydrophilicity, generally the surface has been designed to have high matte property (high irregularity) by matting agents used for improving printing endurance of the image portions. The inventors have studied the correlation between the matte property of the surface and staining caused by printing and have found that staining of non-image portions caused by printing can be markedly reduced by specifying the arithmetical mean deviation of profile (Ra value) of the light-sensitive element in which a matting agent is contained in an undercoat layer.

For printing, water-carrying capacity (or ink/water balance) is important and higher response is preferred in setting the proper printing conditions by changing feeding of ink and that of water. Especially, in the field where offset rotary presses are used, the etching by dampening solution is often omitted at the beginning of printing in order to prevent breaking of paper and thus, ink deposits on non-image portions. Therefore, at the beginning of printing, it is important to clear the ink and fast start up is required.

There is the field of plate making by using commercially available process camera having no reversing mirror as one application of light-sensitive elements for making lithographic printing plates using the silver complex diffusion transfer process. Hitherto, printing plates can be directly obtained by using a process camera provided for reprophotography and by using light-sensitive elements to be exposed from back side thereof and utilizing the silver complex diffusion transfer process. With recent spread of composer cameras such as for opti-copies, the above-mentioned improvements have also been demanded for improving printability of lithographic printing plates made by exposure from back side of light-sensitive elements.

Furthermore, lithographic printing plates made by exposure from back side have the restriction that compounds which increase total transmission density of respective constituting photographic layers through which light passes in exposure from back side, such as titanium oxide, cannot be used since much reduction in sensitivity is brought about although they are effective for diminishing stains caused by printing.

SUMMARY OF THE INVENTION

An object of the present invention is to provide a light-sensitive element for making lithographic printing plates utilizing the silver complex diffusion transfer process which are excellent in staining resistance.

Another object of the present invention is to provide a method for making lithographic printing plates excellent in water-carrying capacity and staining resistance from the light-sensitive elements to be exposed from back side using the silver complex diffusion transfer process, said light-sensitive elements being high in sensitivity.

The above objects have been attained by providing a light-sensitive element for making lithographic printing plates which comprises a support and, coated thereon in succession, at least one undercoat layer, a silver halide emulsion layer and a physical development nuclei layer wherein at least one layer on the silver halide emulsion layer-coated side of the support contains 0.1–2.0 g/m² of a matting agent having an average particle size of 5μ or less and the light-sensitive element has an arithmetical mean deviation of profile (Ra) of 1.2 or less.

DESCRIPTION OF THE INVENTION

The matting agents used in the present invention are solid powders having an average particle size of 5μ or less and include, for example, silica particles and aluminosilicate particles and particles of organic materials such as styrene polymer. In the present invention, silica particles of 1-5μ in average particle size are preferred. Especially, silica particles which are surface treated with hydrogen fluoride are superior in dispersion stability and are preferred. Specific examples of silica particles are Syloid manufactured by Fuji Davison Co. and Mizucasil manufactured by Mizusawa Chemical Co. Examples of aluminosilicate are Silton AM manufactured by Mizusawa Chemical Co.

The matting agent may be contained in any layers on the side of the support on which the silver halide emulsion layer is provided, but preferably may be contained in the silver halide emulsion layer and/or the undercoat layer between the support and the silver halide emulsion layer. Addition amount of the matting agent varies depending on various conditions, but preferably is 0.1-2.0 g/m².

The arithmetical mean deviation of profile (Ra) of the light-sensitive element can be measured by surface roughness configuration measuring machines, for example, Surfcom 500B manufactured by Tokyo Seimitsu Co. When the portion of sampling length l to be measured in the direction of arithmetical mean line (center line) is extracted from profile curve and when center line of the extracted portion is assumed to be x-axis and the vertical direction is assumed to be y-axis and the profile curve is expressed by y=f(x), the arithmetical mean deviation of profile (Ra) is expressed by micrometer unit and calculated by the following formula.

$$Ra = (1/l) \cdot \int |f(x)| dx (\mu m)$$

In the present invention, it is necessary that the arithmetical mean deviation of profile (Ra) is 1.2 or less. If it is more than 1.2, stain is apt to occur during printing.

In order to stably control the Ra value to 1.2 or less, it is essential to realize a high dispersion stability of the matting agent in the coating solution and uniform distribution of the matting agent in coating. However, the matting agent having small particle size used in the present invention generally has the property to readily agglomerate in the coating solution. For solving this problem, there may be employed a method according to which the coating solution is passed through a filter capable of removing particles of 10μ or more just before coating of the solution or at the time of adding the matting agent to the solution or at both points of time whereby the agglomerate is removed or loosely agglomerated particles are dissociated or a method according to which the coating solution is subjected to ultrasonic dispersion to redisperse the matting agent.

Mechanism of the present invention is assumed as follows. The matting agent added for improvement of printing endurance tends to agglomerate and hence, matte property (degree of matte) of the surface is high and ink is apt to be collected in the dents on the surface of non-image portions to cause staining of the non-image portions. When the matte property of the surface is made smaller, ink is hardly collected in the dents and staining hardly occurs. The arithmetical mean deviation of profile (Ra) has correlation with the matte property of the surface and scope of the matting agents used can be specified by this value.

In the present invention, it is preferred that the undercoat layer contains a latex which is non-swellable with water. This latex which is non-swellable with water is one which is swollen little with water and can be defined in the following manner. That is, a test coating solution of the following composition was prepared and coated on a subbed polyethylene terephthalate film at a wet coating amount of 50 g/m² to obtain a test sample. For comparison, a comparative coating solution containing no test latex was prepared and similarly coated to obtain a comparative test sample.

| Test coating solution: | |
| --- | --- |
| Gelatin | 40 g |
| Test latex (solid content) | 20 g |
| Syloid (grade 308) manufactured by Fuji Davison Co. | 6 g |
| Carbon black dispersion (32% solid content) | 8 g |
| Formaldehyde (30% aqueous solution) | 2 g |
| Glyoxal (30% aqueous solution) | 4 g |
| Water to make up totally | 500 g. |

These samples were dipped in 1N sodium hydroxide for 1 minute and increment in weight was measured and this was taken as a liquid absorbing amount. The ratio of the liquid absorbing amount of the test sample and that of the comparative test sample is called swelling ratio. The non-swellable latex used in the present invention is a latex having the swelling ratio of 1.2 or less, preferably 1.1 or less.

The non-swellable latexes used in the present invention are preferably styrene-butadiene latexes, but polybutadiene latexes, polystyrene latexes, styrene-isoprene latexes and the like may also be used. Addition amount of the non-swellable latexes is preferably in the range of 0.2-5.0 g/m² in terms of solid matter.

Gelatin film has swellability with water and tends to lower water-carrying capacity. This phenomenon occurs because the gelatin film absorbs the dampening solution fed to the surface of printing plate until it reaches saturation in swelling and as a result the dampening solution does not effectively act on the surface of plate. When feeding amount of water is changed, partition of the dampening solution between the surface of plate and the gelatin film simultaneously occur and hence, when amount of gelatin is increased, the water-carrying capacity lowers. On the other hand, since the latex which is non-swellable with water shows substantially no swelling with water, lowering in water-carrying capacity is little. It has been found that in order to make smaller the degree of matte of the surface, thickness of binder is necessary and in order to increase the water-carrying capacity, it is effective to use a latex which is non-swellable with water in place of gelatin.

In the present invention, it is preferred that the total amount of gelatin present on the silver halide emulsion layer-provided side of the support is 5 g/m² or less. If the total amount of gelatin exceeds 5 g/m², the water-carrying capacity lowers and this is not preferred.

In the present invention, it is preferred to use titanium oxide in the undercoat layer. The titanium oxide may be any of anatase, rutile or other types and may be subjected to surface treatment for the purpose of improving dispersion stability. Titanium oxide is usually dispersed in water and added at the time of making up of the coating solution before coating, but this is not limitative. Addition amount of titanium oxide varies depending on various conditions, but is preferably in the range of 1-20 g/m$^2$.

In the present invention, it is preferred that at least 95% by weight of the particles of the matting agent in the undercoat layer are arranged in single particle form. If the matting agent is not arranged in the single particle form and agglomerated, ink is apt to be collected in the agglomerated portion, resulting in stain of non-image portions during printing. In the present invention, when the titanium oxide fine particles and the matting agent are used in combination, the titanium oxide fine particles enter between particles of the matting agent and the particles of matting agent are readily dispersed and are readily arranged in the single particle form.

The present invention further provides a preferable plate making method which comprises subjecting to exposure from back side a light-sensitive element to be exposed from back side comprising a polyester film support coated with an organic copolymer and subjected to hydrophilization treatment and, coated thereon in succession, at least one undercoat layer, a silver halide emulsion layer and a physical development nuclei layer wherein total transmission density of the respective constituting layers through which light passes in exposure from back side is about 0.8 or less, the layers on the silver halide emulsion layer-provided side of the support contain 0.1-2.0 g/m$^2$ of a matting agent, the undercoat layer contains a latex non-swellable with water and the arithmetical mean deviation of profile (Ra) of the light-sensitive element is adjusted to 1.2 or less and developing the exposed light-sensitive element by the silver complex diffusion transfer process.

In the above embodiment of the present invention, total transmission density of the respective constituting layers through which light passes in exposure from back side can be adjusted to about 0.8 or less. Normally, in the light-sensitive element to be exposed from back side for making lithographic printing plates using the silver complex diffusion transfer process, the undercoat layer contains pigments such as carbon black or dyes for inhibition of halation and concentration of the pigments or dyes must be adjusted so that total transmission density of the respective constituting layers is about 0.8 or less. If the total transmission density exceeds about 0.8, light-sensitive elements of high sensitivity cannot be obtained.

The light-sensitive element for making lithographic printing plates of the present invention contains gelatin and the layers in which this is contained can be undercoat layer, emulsion layer and physical development nuclei layer. These gelatin-containing layers can be hardened with gelatin hardeners. Examples of the gelatin hardeners are inorganic compounds such as chrome alum, aldehydes such as formalin, glyoxal, malealdehyde and glutaraldehyde, N-methylol compounds such as urea and ethyleneurea, aldehydes such as mucochloric acid and 2,3-dihydroxy-1,4-dioxane, compounds having active halogens such as 2,4-dichloro-6-hydroxy-S-triazine salts and 2,4-dihydroxy-6-chloro-S-triazine salts, divinyl sulfone, divinyl ketone, N,N,N-triacryloylhexahydrotriazine, compounds having two or more ethyleneimino group or epoxy group in the molecule which is an active three-membered ring, and dialdehyde starch as polymer hardeners. These may be used each alone or in combination of two or more.

The hardeners may be added to all of the layers or some or one of the layers. Of course, diffusible hardeners may be added to either one of two layers in the case of two-layer simultaneous coating. The hardeners may be added at the time of preparation of emulsion or in line in coating.

A part of gelatin in the gelatin-containing layers may be replaced with one or more of hydrophilic polymers such as water-soluble gelatin, starches, dextrin, albumin, sodium alginte, hydroxyethyl cellulose, gum arabic, polyvinyl alcohol, polyvinylpyrrolidone, carboxymethyl cellulose, polyacrylamide, styrene-maleic anhydride copolymer, and polyvinylmethyl ethermaleic anhydride copolymer. Besides, vinyl polymer aqueous dispersions (latexes) may also be added to the gelatin layers.

Amount of the polymeric binder used in the undercoat layer is generally 0.5-10 g/m$^2$, more preferably 1-6 g/m$^2$. The undercoat layer may contain pigments such as carbon black or dyes for inhibition of halation. Moreover, the undercoat layer may also contain photographic additives such as developing agent. The undercoat layer may be one which is disclosed in Japanese Patent Kokai Nos. 48-5503, 48-100203 and 49-16507.

The silver halide emulsion layer comprises, for example, silver chloride, silver bromide, silver chlorobromide, and these silver halides containing silver iodide. The silver halide crystals may contain heavy metal salts such as rhodium salts, iridium salts, palladium salts, ruthenium salts, nickel salts and platinum salts in an amount of $10^{-8}$-$10^{-3}$ mol for 1 mol of silver halide. The silver halide crystal has no special limitation and may be cube or fourteen-faced polyhedron and besides, may be core-shell type or tabular grain. The silver halide may be monodispersed or polydispersed and average grain size thereof is preferably in the range of 0.2-0.8 μm. One of preferred examples is monodispersed or polydispersed crystal comprising at least 80 mol% of silver chloride and containing rhodium salt or iridium salt.

The silver halide emulsion can be sensitized in various ways during its preparation or coating. The emulsion is preferably sensitized chemically by the methods well known to the art by using, for example, sodium thiosulfate, alkylthioureas, or gold compounds such as gold rhodanide and gold chloride or in combination thereof. Furthermore, the silver halide emulsion can be direct positive or negative, and sensitized or desensitized with dyes such as cyanine dyes and merocyanine dyes. There are no limitations in wavelengths to which the emulsion can be sensitized or desensitized. Accordingly, there may be carried out orthochromatic sensitization, panchromatic sensitization, sensitization for helium-neon laser, sensitization for argon laser, sensitization for LED, sensitization for laser diode and besides, UV sensitization and visible light sensitization for roomlight processing.

The surface layer present above the emulsion layer contains physical development nuclei. The physical development nuclei may be metal colloid particles such as of silver, antimony, bismuth, cadmium, cobalt, lead, nickel, palladium, rhodium, gold and platinum, sulfides, polysulfides, selenides of these metals or mixtures thereof or mixed crystals thereof. The physical development nuclei layer may not contain hydrophilic binders, but may contain, as hydrophilic binders, hydrophilic polymers or oligomers thereof such as gelatin, starch, dialdehyde starch, carboxymethyl cellulose, gum arabic, sodium alginate, hydroxyethyl cellulose, polystyrenesulfonic acid, sodium polyacrylate, copolymer of vinylimidazole and acrylamide, copolymer of acrylic acid and acrylamide and polyvinyl alcohol. The content thereof is preferably 0.5 g/m² or less. The physical development nuclei layer may further contain developing agents such as hydroquinone, methylhydroquinone and catechol and known hardeners such as formalin and dichloro-S-triazine.

The coating layers such as undercoat layer, silver halide emulsion layer and physical development nuceli layer may contain some of anionic, cationic or ampholytic surfactants and may further contain antifoggants, matting agents, thickening agents and antistatic agents.

As the supports, there may be used paper, synthetic or semisynthetic films and metallic sheets such as aluminum and iron as far as they can stand lithographic printing. One or both sides of the supports may be coated with one or more layers of polymeric films or metallic thin films. The surface of the supports can be subjected to surface treatments in order to enhance adhesion to the coating layer thereon.

Especially preferable supports are papers coated with polyolefin polymers on one or both sides, polyester films, polyester films the surface of which is subjected to hydrophilization treatment and aluminum sheets subjected to surface treatments. These supports may contain pigments for inhibiton of halation and solid fine particles for improvement of surface properties. In addition, the supports may be light transmissive in order that exposure from back side can be performed.

The processing solution for development used in the present invention may contain alkaline substances such as sodium hydroxide, potassium hydroxide, lithium hydroxide and sodium tertiary phosphate; preservatives such as sulfites; silver halide solvents such as thiosulfates, thiocyanates, cyclic imides, 2-mercaptobenzoic acid, and amines; thickening agents such as hydroxyethyl cellulose and carboxymethyl cellulose; antifoggants such as potassium bromide and the compounds described in Japanese Patent Kokai No. 47-26201; developing agents such hydroquinones, catechol and 1-phenyl-3-pyrazolidone; and developing modifiers such as polyoxyalkylene compounds and onium compounds. The processing solution may further contain the compounds as described in U.S. Pat. No. 3,776,728 which improve ink receptivity of the surface silver layer.

The surface silver layer of the lithographic printing plate of the present invention formed after development can be rendered ink receptive or enhanced in ink receptivity by known surface processing solutions. Examples of the surface processing solutions are those which are described in Japanese Patent Kokoku No. 48-29723 and U.S. Pat. No. 3,721,559. The printing method, etch solution and dampening solution may be those which are known to the art.

The following nonlimiting examples further illustrate the present invention.

EXAMPLE 1

The following undercoat layer was coated on the surface of a polyester film support which had been subjected to aqueous undercoat treatment with the undercoat composition containing epoxy compound as described in Japanese Patent Kokai No. 60-213942.

| Coating solution for undercoat layer: | |
|---|---|
| Gelatin | 35 g |
| Water | 200 g |
| Syloid manufactured by Fuji Davison Co. | Y g |
| Carbon black dispersion (32% in solid content) | 8 g |
| Formaldehyde (30% aqueous solution) | 2 g |
| Glyoxal (30% aqueous solution) | 4 g |
| Surfactant | 6 ml |
| Water to make up totally | 500 g. |

Coating amount was 50 g/m² in wet content. On this undercoat layer was coated an orthochromatically sensitized high contrast silver chloride emulsion at a coating amount of 1.5 g/m² in terms of silver nitrate. After drying, the coated support was heated at 50° C. for 2 days. A solution was prepared by adding 0.04 g/m² of sodium polyacrylate (average molecular weight: 260000) to the nuclei coating solution described in Example 2 of Japanese Patent Kokai No. 58-21602 (containing copolymer of acrylamide and imidazole of No. 3 as polymer and 0.8 g/m² of hydroquinone as developing agent) and the resulting solution was filtered by a filter to remove particles of 10μ or more and then was coated on the heated emulsion layer. Addition amount of Syloid and average particle size thereof in Samples (1), (2) and (3) and Comparative Samples (a) and (b) are shown in Table 1. The particle size was obtained by Cole counter method. Samples (2') and (3') were further prepared by coating the same coating solutions as used for Samples (2) and (3) without passing the solutions through the filter.

The above samples were exposed imagewise by process camera CP-550 II manufactured by Mitsubishi Paper Mills Ltd. and then subjected to developing treatment. The development was carried out with the following diffusion transfer developer at 30° C. for 20 seconds. Stabilization was carried out with the following stabilizing solution at 25° C. for 20 seconds, followed by drying.

| Diffusion transfer developer: | |
|---|---|
| Water | 700 g |
| Sodium hydroxide | 18 g |
| Potassium hydroxide | 7 g |
| Anhydrous sodium sulfite | 50 g |
| 2-Mercaptobenzoic acid | 1 g |
| Uracil | 10 g |
| 2-Methylamino ethanol | 30 g |
| 5-Phenyl-2-mercapto-1,3,4-oxadiazole | 0.1 g |
| Potassium bromide | 1 g |
| Water to make up totally | 1,000 ml. |
| Stabilizing solution: | |
| Water | 600 g |
| Citric acid | 10 g |
| Sodium citrate | 35 g |
| Colloidal silica (20%) | 5 g |
| Ethylene glycol | 5 g |
| Water to make up totally | 1,000 ml. |

Printing was carried out by A. B. Dick 350CD (tradename for an offset printing machine supplied by A. B. Dick Co.). Printing endurance was evaluated as follows: Each of the samples was treated with the following etch solution and printing was carried out with F Gloss Sumi manufactured by Dainippon Ink & Chemicals Inc. as ink and using the following dampening solution. Printing endurance was evaluated in terms of the number of prints obtained before the printing became impossible due to partial disappearance of printed image caused by partial wearing off of the silver images and graded by the following criteria.
(A) More than 20,000 prints
(B) 10,000 to 20,000 prints
(C) 5,000 to 10,000 prints
(D) 2,000 to 5,000 prints
(F) Less than 2,000 prints The results of printing are shown in Table 1.

| Etch solution: | |
|---|---|
| Water | 600 g |
| Isopropyl alcohol | 400 g |
| Ethylene glycol | 50 g |
| 3-mercapto-4-acetamido-5-n-heptyl-1,2,4-triazole | 1 g |
| Dampening solution: | |
| O-Phosphoric acid | 10 g |
| Nickel nitrate | 5 g |
| Sodium nitrite | 5 g |
| Ethylene glycol | 100 g |
| Colloidal silica (20% solution) | 28 g |
| Water to make up totally | 2,000 ml. |

Water retention of non-image portions (indicating degree of staining of the non-image portions) was evaluated as follows. Printing was carried out by A. B. Dick 350CD using F Gloss Purple 68S manufactured by Dainippon Ink & Chemical Inc. as ink and 2.5% aqueous solution of KPS #500 manufactured by Lousos Co. as dampening solution. Water retention was evaluated in terms of the number of prints obtained before the printing became impossible due to occurrence of stain and graded by the following criteria.
(A) More than 3000 prints
(B) 1000 to 3000 prints
(C) 500 to 1000 prints
(D) 100 to 500 prints
(E) Less than 100 prints The results are shown in Table 1.

TABLE 1

| | Average particle size of Syloid (μm) | Amount of Syloid g/m² | Arithmetical mean deviation of profile (Ra) | Printing endurance | Staining resistance |
|---|---|---|---|---|---|
| Sample (1) | 2.5 | 0.3 | 0.3 | C | A |
| Sample (2) | 2.5 | 2.0 | 0.9 | B | B |
| Sample (3) | 3.0 | 0.75 | 0.5 | B | A |
| Sample (2') | 2.5 | 2.0 | 1.3 | B | C |
| Sample (3') | 3.0 | 0.75 | 0.7 | B | B |
| Comparative Sample (a) | 2.5 | 2.5 | 1.8 | B | D |
| Comparative Sample (b) | 5.5 | 1.5 | 1.8 | A | E |

As can be seen from Table 1, Comparative Samples (a) and (b) which contained Syloid in a large amount and had an arithmetical mean deviation of profile of more than 1.2 were inferior in staining resistance while Samples (1), (2) and (3) of the present invention which had an arithmetical mean deviation of profile of less than 1.2 were superior in staining resistance and all samples were at nearly the same level in printing endurance.

Samples (2') and (3') made without passing the coating solutions through filter had the same formulation as of Samples (2) and (3), but had higher arithmetical mean deviation (Ra) of profile due to agglomeration and Sample (2') had Ra value of more than 1.2 and was inferior in staining resistance.

EXAMPLE 2

Samples were prepared in the same manner as in Example 1 with changing amounts of gelatin and Syloid and grade of Syloid in the coating solution for undercoat layer as shown in Table 2. Printing was carried out and water retention of non-image portions (staining) was evaluated in the same manner as in Example 1. The coating solution was passed through a filter to remove particles of more than 10μ just before coating in all of the samples. The results are shown in Table 2.

TABLE 2

| | Amount of gelatin (g/m²) | Average particle size of matting agent (μm) | Amount of matting agent (g/m²) | Arithmetical mean deviation of profile (Ra) | Staining resistance |
|---|---|---|---|---|---|
| Sample (4) | 3.5 | 2.5 | 0.7 | 0.7 | B |
| Sample (5) | 3.5 | 3.0 | 0.7 | 0.6 | B |
| Sample (6) | 5.5 | 2.5 | 2.5 | 1.0 | B |
| Sample (7) | 5.5 | 3.5 | 0.7 | 1.1 | B |
| Comparative Sample (c) | 5.5 | 5.5 | 1.5 | 1.6 | E |

As can be seen from Table 2, Samples (4)–(7) of the present invention had an arithmetical mean deviation of profile (Ra) of less than 1.2 and were superior in staining resistance while Comparative Sample (c) had an Ra of more than 1.2 and was inferior in staining resistance.

EXAMPLE 3

The following coating solution for undercoat layer was coated in the same manner as in Example 1.

| Coating solution for undercoat layer: | |
|---|---|
| Gelatin | 3.5 g |
| Water | 20.0 g |
| Syloid manufactured by Fuji Davison Co. (grade 978, average particle size 2.5μ) | 0.6 g |
| Carbon black dispersion (32% in solid content) | 0.8 g |
| Formaldehyde (30% aqueous solution) | 0.2 g |
| Glyoxal (30% aqueous solution) | 0.4 g |
| Polylac 752A manufactured by Mitsui Toatsu Chemicals, Inc. (styrene.butadiene latex, 47.5% in solid content) | 5.0 g |
| Surfactant | 0.6 ml |
| Water to make up totally | 50.0 g. |

Coating amount was 50 g/m² in wet content. Swelling ratio by addition of Polylac 752A was 1.08 measured by the test method mentioned above and this corresponds to the value obtained using the latex non-swellable with water which is used in the present invention. On this undercoat layer was coated an orthochromatically sensitized high contrast silver chloride emulsion at a coating amount of 1.5 g/m² in terms of silver nitrate and at a gelatin coating amount of 0.8 g/m². After drying, the coated support was heated at 50° C. for 2 days. A solution was prepared by adding 0.04 g/m² of sodium polyacrylate (average molecular weight: 260000) to the nuclei coating solution described in Example 2 of Japanese Patent Kokai No. 58-21602 (containing copolymer of acrylamide and imidazole of No. 3 as polymer and 0.8 g/m² of hydroquinone as developing agent). This solution was coated on the emulsion layer.

Sample (8)

Comparative Sample (d) was prepared in the same manner as above except that the undercoat layer did not contain Polylac 752A.

Printing evaluation was conducted in the same manner as in Example 1 and the results are shown in Table 3, Next, water-carrying capacity was evaluated in the following manner. Printing was carried out with the sample printing plates without subjecting to treatment with dampening solution using New Champion Sumi N manufactured by Dainippon Ink & Chemicals Inc. as ink. The response was evaluated by the number of papers delivered before clearing of ink began to occur after starting of printing and graded by the following criteria.
(A) Less than 10 sheets of papers
(B) 10-20 sheets
(C) 20-50 sheets
(D) 50-100 sheets
(E) More than 100 sheets The results are shown in Table 3.

TABLE 3

| | Latex non-swellable with water | Arithmetical mean deviation of profile (Ra) | Printing endurance | Printing resistance | Water carrying capacity |
| --- | --- | --- | --- | --- | --- |
| Sample (8) | Present | 1.0 | B | B | B |
| Comparative Sample (d) | Absent | 1.3 | B | D | B |

As can be seen from Table 3, Comparative Sample (d) which did not contain Polylac 752A which was a styrene.butadiene latex was inferior in staining resistance while Sample (8) of the present invention was superior in staining resistance and was equal to the comparative sample in water-carrying capacity.

EXAMPLE 4

Samples were prepared in the same manner as in Example 3 except that amounts of gelatin and Polylac 752A in the following coating solution for undercoat layer were as shown in Table 4 and printing evaluations were similarly conducted. The results are shown in Table 4.

| Coating solution for undercoat layer: | |
| --- | --- |
| Gelatin | X g |
| Water | 20.0 g |
| Syloid manufactured by Fuji Davison Co. (grade 308, average particle size 3.5μ) | 0.6 g |
| Carbon black dispersion (32% in solid content) | 0.8 g |
| Formaldehyde (30% aqueous solution) | 0.2 g |
| Glyoxal (30% aqueous solution) | 0.4 g |
| Polylac 752A manufactured by Mitsui Toatsu Chemicals, Inc. (styrene.butadiene latex, 47.5% in solid content) | Y g |
| Surfactant | 0.6 ml |
| Water to make up totally | 50.0 g |

As can be seen from Table 4, Sample (10) had total gelatin amount of 6.3 g/m² in the layers on the emulsion layer-provided side of the support and had a small arithmetical mean deviation of profile (Ra), but was nearly the same in degree of stain as Sample (9) and was inferior in printing endurance and water-carrying capacity. Sample (11) did not contain Polylac as compared with Sample (10) and was the same as Sample (9) in arithmetical mean deviation of profile (Ra), but nearly the same as Sample (9) in degree of staining like Sample (10) and was inferior in printing endurance and water-carrying capacity. Sample (9) which contained Polylac 752 A which was a styrene.butadiene latex and had total gelatin content of less than 5 g/m² in all coating layers on the emulsion layer-provided side of the support had the same arithmetical mean deviation of profile (Ra) as Sample (11) and showed excellent water-carrying capacity with maintaining staining resistance.

TABLE 4

| | Amount of gelatin (g/m²) | Amount of polylac (g/m²) | Arithmetical mean deviation of profile (Ra) | Printing endurance | Staining resistance | Water carrying capacity |
| --- | --- | --- | --- | --- | --- | --- |
| Sample (9) | 3.5 | 5.0 | 1.0 | B | B | B |
| Sample (10) | 5.5 | 5.0 | 0.8 | C | B | E |
| Sample (11) | 5.5 | 0 | 1.0 | C | B | E |

EXAMPLE 5

Samples were prepared in the same manner as in Example 3 except that amounts of titanium oxide and Polylac 752A in the following coating solution for undercoat layer were as shown in Table 5 and printing evaluations were similarly conducted. The results are shown in Table 5.

| Coating solution for undercoat layer: | |
| --- | --- |
| Gelatin | 3.5 g |
| Water | 20.0 g |
| Titanium oxide (TR-1 manufactured by Sakai Chemical Co.) | X g |
| Syloid manufactured by Fuji Davison | 0.6 g |

| Coating solution for undercoat layer: | |
|---|---|
| Co. (grade 978, average particle size 2.5μ) | |
| Carbon black dispersion (32% in solid content) | 0.8 g |
| Formaldehyde (30% aqueous solution) | 0.2 g |
| Glyoxal (30% aqueous solution) | 0.4 g |
| Polylac 752A manufactured by Mitsui Toatsu Chemicals, Inc. (styrene·butadiene latex, 47.5% in solid content) | Y g |
| Surfactant | 0.6 ml |
| Water to make up totally | 50.0 g. |

TABLE 5

| | Amount of titanium oxide (g/m²) | Amount of polylac (g/m²) | Arithmetical mean deviation of profile (Ra) | Printing endurance | Staining resistance | Water-carrying capacity |
|---|---|---|---|---|---|---|
| Sample (12) | 0 | 5.0 | 1.0 | B | B | B |
| Sample (13) | 5.0 | 5.0 | 0.8 | B | A | A |

As can be seen from Table 5, Sample (13) containing titanium oxide was superior to Sample (12) in staining resistance and water-carrying capacity.

EXAMPLE 6

Sample (14) was prepared in the same manner as in Example 3 except that Nipol 1577 (acrylonitrile·butadiene latex) manufactured by Japan Zeon Co. was used in place of Polylac 752A and evaluations were conducted. Swelling ratio by addition of Nipol 1577 was measured using the test method mentioned above to obtain 1.11. This value corresponds to the value obtained using the latex non-swellable with water which is used in the present invention. The sample prepared in this way was excellent in staining resistance and water-carrying capacity as in Example 3,

EXAMPLE 7

Comparative Sample (e) was prepared in the same manner as in preparation of Sample (8) in Example 3 except that Mizukasil P-78F (average particle size 12μ) manufactured by Mizusawa Chemical Co. was used as silica particles in place of Syloid (grade 978, average particle size 2.5μ) and evaluation was similarly conducted. Arithmetical mean deviation of profile (Ra) of Comparative Sample (e) was 1.5 and grade of stain was D, which was much inferior to that in the present invention.

EXAMPLE 8

The following coating solution for undercoat layer was coated in the same manner as in Example 1.

| Coating solution for undercoat layer: | |
|---|---|
| Gelatin | 55 g |
| Water | 200 g |
| Titanium oxide (TR-1 manufactured by Sakai Chemical Co.) | 50 g |
| Water | 100 g |
| Syloid manufactured by Fuji Davison Co. (grade 978, average particle size 2.5μ) | 7.5 g |
| Carbon black dispersion (32% in solid content) | 8 g |
| Formaldehyde (30% aqueous solution) | 2 g |
| Glyoxal (30% aqueous solution) | 4 g |
| Surfactant | 6 ml |
| Water to make up totally | 600 g. |

Coating amount was 60 g/m² in wet content. Observation by electron microscope revealed that particles of at least 95% by weight of Syloid were arranged in the single particle form. On this undercoat layer was coated an orthochromatically sensitized high contrast silver chloride emulsion at a coating amount of 1.5 g/m² in terms of silver nitrate. After drying, the coated support was heated at 50° C. for 2 days. A solution was prepared by adding 0.04 g/m² of sodium polyacrylate (average molecular weight: 260000) to the nuclei coating solution described in Example 2 of Japanese patent Kokai No. 58-21602 (containing copolymer of acrylamide and imidazole of No. 3 as polymer and 0.8 g/m² of hydroquinone as developing agent). This solution was coated on the emulsion layer. (Sample (15)).

| Comparative coating solution for undercoat layer: | | |
|---|---|---|
| A | Gelatin | 55 g |
| | Water | 200 g |
| | Syloid manufactured by Fuji Davison Co. (grade 978) | 7.5 g |
| | Carbon black dispersion (32% in solid content) | 8 g |
| | Formaldehyde (30% aqueous solution) | 2 g |
| | Glyoxal (30% aqueous solution) | 4 g |
| | Surfactant | 6 ml |
| B | Titanium oxide (TR-1 manufactured by Sakai Chemical Co.) | 50 g |
| | Water | 100 g |
| | Water to make up totally | 600 g. |

As comparative sample, a coating solution having the same composition as above coating solution for undercoat layer of this example, but prepared by adding the titanium oxide dispersion of B to the part of A prepared and left to stand for 2 hours at 40° C. was coated in the same manner as in preparation of Sample (1). Observation by electron microscope revealed that at least 30% by weight of particles of Syloid were agglomerated and thus, this did not correspond to the present invention. Thereafter, Comparative Sample (f) was prepared in the same manner as in preparation of Sample (15). Evaluations were conducted in the same manner as in Example 3. The results are shown in Table 6.

TABLE 6

| | Amount of Syloid 978 (g/m²) | Syloid in single particle form | Arithmetical mean deviation of profile (Ra) | Water retention | Printing endurance |
|---|---|---|---|---|---|
| Sample (15) | 0.75 | 95% or more | 0.8 | A | A |
| Comparative sample (f) | 0.75 | 70% | 1.5 | D | C |

As can be seen from Table 6, Comparative Sample (f) in which at least 30% by weight of particles of Syloid were agglomerated was inferior in printing endurance and water retention. On the other hand, Sample (15) in which at least 95% by weight of particles of Syloid were arranged in the single particle form was superior in printing endurance and water retention.

EXAMPLE 9

Samples were prepared in the same manner as in Example 8 except that amounts of Syloid and titanium oxide and average particle size of Syloid in the coating solution for undercoat layer were as shown in Table 7 and printing evaluations were similarly conducted. The results are shown in Table 7.

TABLE 7

| | Average particle size of Syloid (μ) | Amount of Syloid g/m² | Amount of titanium oxide g/m² | Arithmetical mean deviation of profile (Ra) | Syloid in single particle form | Water retention | Printing endurance |
|---|---|---|---|---|---|---|---|
| Sample (16) | 3.5 | 0.6 | 2.5 | 0.8 | 95% or more | B | A |
| Sample (17) | 2.5 | 0.75 | 5.0 | 0.6 | 95% or more | A | A |
| Comparative Sample (g) | 7.0 | 0.75 | 5.0 | 1.3 | 95% or more | C | B |
| Comparative Sample (h) | 2.5 | 5.0 | 5.0 | 1.9 | less than 70% | D | C |

As can be seen from Table 7, Comparative Sample (g) having an average particle size of Syloid of 7 microns and Comparative Sample (h) containing less than 70% of Syloid in the single particle form were inferior in printing endurance and water retention while Samples (16) and (17) of the present invention were superior in printing endurance and water retention.

EXAMPLE 10

The following coating solution for undercoat layer was coated in the same manner as in Example 1.

| Coating solution for undercoat layer: | |
|---|---|
| Gelatin | 3.5 g |
| Water | 20.0 g |
| Syloid manufactured by Fuji Davison Co. (grade 978, average particle size 2.5μ) | 0.6 g |
| Carbon black dispersion (32% in solid content) | 0.2 g |
| Formaldehyde (30% aqueous solution) | 0.2 g |
| Glyoxal (30% aqueous solution) | 0.4 g |
| Polylac 752 (styrene.butadiene latex, 47.5% in solid content) | 5.0 g |

| -continued | |
|---|---|
| Coating solution for undercoat layer: | |
| Surfactant | 0.6 ml |
| Water to make up totally | 50.0 g. |

Coating amount was 50 g/m² in wet content. Transmission density of this sample was 0.5. Swelling ratio by addition of Polylac 752A measured by the test method mentioned above was 1.08 and this corresponded to the value obtained by the latex non-swellable with water according to the present invention. On this undercoat layer was coated an orthochromatically sensitized high contrast silver chloride emulsion at a coating amount of 1.5 g/m² in terms of silver nitrate. After drying, the sample was heated at 50° C. for 2 days. A solution was prepared by adding 0.04 g/m² of sodium polyacrylate (average molecular weight: 260000) to the nuclei coating solution described in Example 2 of Japanese Patent Kokai No. 58-21602 (containing copolymer of acrylamide and imidazole of No. 3 as polymer and 0.8 g/m² of hydroquinone as developing agent). This solution was coated on the emulsion layer. (Sample (18)).

For comparison, a coating solution for undercoat layer was prepared in the same manner as above except that Polylac 752A was not contained and comparative sample was prepared in the same manner as above (Comparative Sample (i)).

These samples were exposed imagewise from back side by process camera OS-II manufactured by Mitsubishi Paper Mills Ltd. and developed. Development was carried out with the diffusion transfer developer used in Example 1 at 30° C. for 20 seconds. Stabilization was carried out with the stabilizing solution used in Example 1 at 25° C. for 20 seconds, followed by drying. Printing evaluations were conducted in the same manner as in Example 3. The results are shown in Table 8.

TABLE 8

|  | Latex non-swellable with water | Arithmetical mean deviation of profile (Ra) | Printing endurance | Printing resistance | Water-carrying capacity |
|---|---|---|---|---|---|
| Sample (18) | Present | 1.0 | B | B | B |
| Comparative Sample (i) | Absent | 1.3 | B | D | B |

As can be seen from Table 8, Comparative Sample (i) containing no Polylac 752A which was a styrene.-butadiene latex was inferior in staining resistance while Sample (18) was superior in staining resistance and equal to the comparative sample in water-carrying capacity.

EXAMPLE 11

The following coating solution for undercoat layer was coated in the same manner as in Example 10.

| Coating solution for undercoat layer: | |
|---|---|
| Gelatin | 35 g |
| Water | 200 g |
| Syloid manufactured by Fuji Davison Co. (grade X) | Y g |
| Carbon black dispersion (32% in solid content) | 2 g |
| Formaldehyde (30% aqueous solution) | 2 g |
| Glyoxal (30% aqueous solution) | 4 g |
| Polylac 752 (styrene.butadiene latex, 47.5% in solid content) | 5.0 g |
| Surfactant | 6 ml |
| Water to make up totally | 500 g. |

Coating amount was 50 g/m² in wet content. Grade X and addition amount Y of Syloid are shown in Table 9, Transmission density of this sample was 0.5, On this undercoat layer was coated an orthochromatically sensitized high contrast silver chloride emulsion at a coating amount of 1.5 g/m² in terms of silver nitrate. After drying, the sample was heated at 50° C. for 2 days. A solution was prepared by adding 0.04 g/m² of sodium polyacrylate (average molecular weight: 260000) to the nuclei coating solution descried in Example 2of Japanese Patent Kokai No. 58-21602 (containing copolymer of acrylamide and imidazole of No. 3 as polymer and 0.8 g/m² of hydroquinone as developing agent). This solution was coated on the emulsion layer. (Samples (19), (20) and (21) and Comparative Samples (j) and (k)).

Thereafter, printing plate samples were prepared and printing evaluations were conducted in the same manner as in Example 10. The results are shown in Table 9.

As can be seen from Table 9, Comparative Samples (j) and (k) containing Syloid in large amounts had an arithmetical mean deviation of profile of more than 1.2 and were inferior in staining resistance. On the other hand, Samples (19), (20) and (21) of the present invention had an arithmetical mean deviation of profile of less than 1.2 and were superior in staining resistance.

TABLE 9

|  | Grade of Syloid | Average particle size (μm) | Amount of Syloid (g/m²) | Arithmetical mean deviation of profile (Ra) | Staining resistance |
|---|---|---|---|---|---|
| Sample (19) | 978 | 2.5 | 0.4 | 0.6 | A |
| Sample (20) | 978 | 2.5 | 0.6 | 0.7 | B |
| Sample (21) | 308 | 3.5 | 0.4 | 0.6 | B |
| Comparative Sample (j) | 978 | 2.5 | 3.0 | 2.0 | D |
| Comparative Sample (k) | 308 | 3.5 | 1.4 | 1.7 | D |

EXAMPLE 12

Comparative Sample (l) was prepared in the same manner as in preparation of Sample (19) in Example 11 except that amount of the carbon black dispersion (solid content 32%) was 8 g in the coating solution for undercoat layer in Example 11, In the same manner as in Example 11, this was exposed imagewise from back side by process camera OS-II manufactured by Mitsubishi Paper Mills Ltd., and developed and printing evaluations were conducted. The results are shown in Table 10, As can be seen from Table 10, Comparative Sample (l) required exposing time more than 10 times that required by Sample (19). On the other hand, Sample (19) had high sensitivity and excellent staining resistance.

The present invention provides a method for making lithographic printing plates having high sensitivity and excellent in water-carrying capacity and staining resistance by exposing the samples of the present invention from back side and developing them by the silver complex diffusion transfer process.

TABLE 10

|  | Arithmetical mean deviation of profile (Ra) | Amount of carbon black (g/m²) | Transmission density | Exposing time f = 16 (sec) | Staining resistance |
|---|---|---|---|---|---|
| Sample (19) | 0.6 | 0.2 | 0.5 | 25 | A |
| Comparative Sample (l) | 0.6 | 0.8 | 1.6 | 260 | B |

What is claimed is:

1. A light-sensitive element for lithographic printing plates which comprises a support and, coated thereon in succession, at least one undercoat layer, a silver halide emulsion layer and a physical development nuclei layer wherein at least one of the layers on the silver halide emulsion layer-provided side of the support contains 0.1–2.0 g/m² of a matting agent of 5μ or less in average particle size and the light-sensitive element has an arithmetical mean deviation of profile Ra of 1.2 or less.

2. A light-sensitive element according to claim 1, wherein the undercoat layer contains the matting agent of 5μ or less in average particle size and a latex which is non-swellable with water and total amount of gelatin in the layers on the silver halide emulsion layer-provided side of the support is 5 g/m² or less.

3. A light-sensitive element according to claim 2, wherein the latex contained in the undercoat layer is a styrene.butadiene latex.

4. A light-sensitive element according to claim 1, wherein the undercoat layer contains titanium oxide.

5. A light-sensitive element according to claim 4, wherein total amount of gelatin in the layers on the silver halide emulsion layer-provided side of the support is 5 g/m² or less.

6. A light-sensitive element according to claim 1, wherein at least 95% by weight of the particles of the matting agent in the undercoat layer are arranged in single particle form.

* * * * *